United States Patent
Kusakabe et al.

(10) Patent No.: US 9,517,520 B2
(45) Date of Patent: Dec. 13, 2016

(54) APPARATUS OF MOUNTING AND REMOVING COMPONENT, METHOD OF MOUNTING COMPONENT AND METHOD OF REMOVING COMPONENT

(71) Applicant: FUJITSU LIMITED, Kawasaki-shi, Kanagawa (JP)

(72) Inventors: Yasuyuki Kusakabe, Kawasaki (JP); Tooru Harada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 695 days.

(21) Appl. No.: 13/754,351

(22) Filed: Jan. 30, 2013

(65) Prior Publication Data
US 2013/0284707 A1    Oct. 31, 2013

(30) Foreign Application Priority Data
Apr. 27, 2012  (JP) .................................. 2012-103201

(51) Int. Cl.
    *B23K 1/005*    (2006.01)
    *B23K 1/018*    (2006.01)
(52) U.S. Cl.
    CPC ............. *B23K 1/005* (2013.01); *B23K 1/0056* (2013.01); *B23K 1/018* (2013.01)
(58) Field of Classification Search
    CPC ........ B23K 1/005; B23K 1/018; B23K 1/0056

USPC ............ 219/121.67, 121.72, 121.73, 121.74, 219/121.82, 121.83
See application file for complete search history.

(56) References Cited

U.S. PATENT DOCUMENTS

| | | | |
|---|---|---|---|
| 2009/0277889 A1* | 11/2009 | Kobayashi | B23K 26/0057 219/121.67 |
| 2011/0240720 A1* | 10/2011 | Okada | B23K 1/018 228/264 |

FOREIGN PATENT DOCUMENTS

| | | |
|---|---|---|
| JP | 10-214859 | 8/1998 |
| JP | 2003-204150 | 7/2003 |
| JP | 2011-211073 | 10/2011 |

OTHER PUBLICATIONS

Japanese Office Action mailed Nov. 24, 2015 in related Japanese Application No. 2012-103201.
Japanese Office Action mailed May 10, 2016 in related Japanese Application No. 2012-103201.

* cited by examiner

*Primary Examiner* — Thien S Tran
(74) *Attorney, Agent, or Firm* — Staas & Halsey LLP

(57) ABSTRACT

An apparatus for mounting and removing a component includes: a light source configured to radiate light toward a component supported by solder; a light sensor configured to sense displacement of the component; and a member mounted on the component, the member including a hole in a portion to be irradiated with the light of the light source.

20 Claims, 13 Drawing Sheets

US 9,517,520 B2

APPARATUS OF MOUNTING AND REMOVING COMPONENT, METHOD OF MOUNTING COMPONENT AND METHOD OF REMOVING COMPONENT

CROSS-REFERENCE TO RELATED APPLICATION

This application is based upon and claims the benefit of priority of the prior Japanese Patent Application No. 2012-103201, filed on Apr. 27, 2012, the entire contents of which are incorporated herein by reference.

FIELD

The embodiments discussed herein are related to an apparatus of mounting and removing a component, a method of mounting a component, and a method of removing a component.

BACKGROUND

Techniques for mounting and removing components that are to be or have been soldered have been designed.

Related art is discussed in Japanese Laid-open Patent Publication Nos. 2003-204150 and 2011-211073.

SUMMARY

According to one aspect of the embodiments, an apparatus for mounting and removing a component includes: a light source configured to radiate light toward a component supported by solder; a light sensor configured to sense displacement of the component; and a member mounted on the component, the member including a hole in a portion to be irradiated with the light of the light source.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When a component is soldered or when a component that is soldered is removed, solder is melted. For example, the solder may be melted by heat of light radiated onto the component.

When a component is heated in a non-contact manner, the solder may not be completely melted. Therefore, for example, the melting of the solder may be determined when the component is heated in a non-contact manner.

For example, the melting of the solder may be estimated from a temperature profile during heating, or the melting may be sensed based on the temperature of the solder measured by a contact or non-contact temperature sensor. The solder may not be melted as estimated, and the temperature of the solder may not be able to be measured.

The melting of the solder may be determined based on the displacement of the component measured by a light sensor. Since the component, which is supported by the solder, is displaced in accordance with the melting of the solder, the melting of the solder is sensed based on the displacement of the component measured by the light sensor. When the solder is melted by the heat of the light, which is radiated onto the component, scattered light of the radiated light is incident on the light sensor, and as a result, the melting of the solder may not be sensed.

Figure 1:
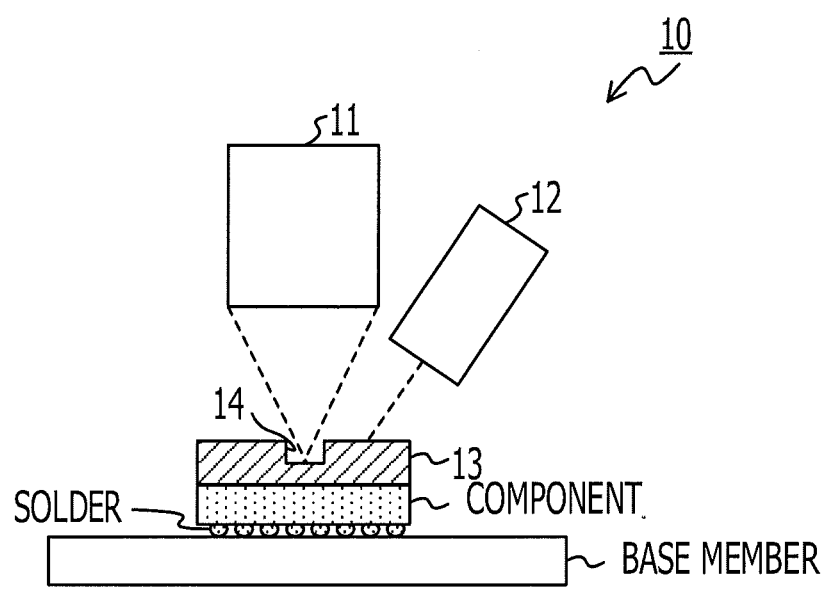
FIG. 1 illustrates an exemplary apparatus for mounting and removing a component.

FIG. 1 illustrates an exemplary apparatus of mounting and removing a component. An apparatus 10 of mounting and removing a component depicted in FIG. 1 includes a light source 11, a light sensor 12, and a member 13 configured to mount and remove a component (hereinafter simply referred to as a member 13). A component is mounted and removed using the apparatus 10 for mounting and removing a component.

The light source 11 radiates light that causes solder of a component that is supported by the solder to be melted. The component is heated by the phenomenon of thermal radiation. The light source 11 may be a light source that is able to radiate light that heats the component, and for example, a halogen lamp, a xenon lamp, or a laser source may be used as the light source 11. When a non-directional point source, such as a halogen lamp or a xenon lamp, whose light spreads in various directions from the light source is used as the light source 11, the component may effectively be heated by using a structure that converges light beams. For example, a converging unit such as a reflecting mirror or a converging lens may be used to converge light beams.

The light sensor 12 senses the melting of the solder based on the displacement of the component when the solder is melted. For example, the light sensor 12 measures the position of the component by receiving reflected light of light for measuring (hereinafter simply referred to as measurement light) that is radiated onto the component, and the light sensor 12 senses the melting of the solder based on the displacement of the component when the solder is melted. The light sensor 12 may sense the displacement of the component with reflected light of measurement light that is directly radiated onto the component or may indirectly sense the displacement of the component with reflected light of measurement light that is radiated onto the member 13.

The member 13 may be a member that is to be mounted on the component. Upon receiving light of the light source 11, the member 13 transfers heat of the light to the component. A hole 14 that does not extend through the member 13 is provided in the member 13 so as to face the light source 11. When the light of the light source 11 is adjusted to irradiate the hole 14, heat of the light incident on the hole 14 is transferred to the component, and as a result, the component is heated. The hole 14 may have such a size as to encompass a range that is to be irradiated with the light of the light source 11. When the light of the light source 11 is adjusted to irradiate the hole 14, irradiation of diffused light caused by the light of the light source 11 to the periphery of the hole 14 is reduced. In the case where the light source 11 is a laser source, the hole 14 may have such a size as to encompass a cross-sectional area of a laser beam. The member 13 may be a member that transfers heat of light to the component. The member 13 may include a hole that reduces the amount of scattered light that is scattered on a surface of the component when the light of the light source 11 is radiated.

Figure 2:
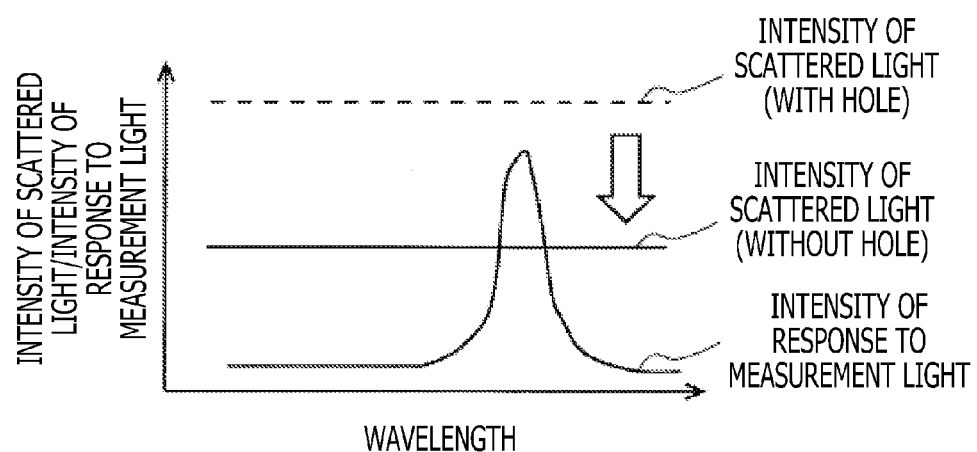
FIG. 2 illustrates an exemplary intensity of scattered light and an exemplary response intensity of measurement light.

In the apparatus 10 for mounting and removing a component, since the light radiated from the light source 11 is incident on the hole 14, the amount of light that is scattered in the periphery of the hole 14 is reduced, and as a result, the amount of scattered light that is incident on the light sensor 12 is reduced. FIG. 2 illustrates an exemplary intensity of a scattered light and an exemplary response intensity of measurement light. The vertical axis indicates the intensity of the scattered light incident on the light sensor 12 and the response intensity of the measurement light of the light sensor 12 incident on the light sensor 12 (the intensity of the reflected light of the measurement light incident on the light sensor 12). The horizontal axis indicates the wavelength of light.

In the case where the intensity of the scattered light incident on the light sensor 12 exceeds the peak intensity of the measurement light incident on the light sensor 12, the displacement of the component may not be sensed by the light sensor 12. In the case where the intensity of the scattered light incident on the light sensor 12 is lower than the peak intensity of the measurement light incident on the light sensor 12, the measurement light will be captured by the light sensor 12, and thus the displacement of the component will be sensed by the light sensor 12.

The intensity of the scattered light of the light of the light source 11 incident on the light sensor 12 may be adjusted based on the position, dimensions, or cross-sectional shape of the hole 14. For example, the intensity of the scattered light may be adjusted within a range not exceeding the peak intensity of the response to the measurement light. The hole 14 is positioned at a location to which the light of the light source 11 is irradiated. For example, the dimensions of the hole 14 may be reduced so that it is not likely that the scattered light will leak from the hole 14. For example, the cross-sectional shape of the hole 14 may be formed as such a shape that it is not likely that the light, which is incident on the hole 14, will be scattered outside of the hole 14. The intensity of the scattered light incident on the light sensor 12 may be reduced.

For example, in the case where a bottom surface of the member 13 has a shape that closely fits a top surface of the component, heat of the member 13 may easily be transferred to the component. If, for example, the top surface of the component is flat, the bottom surface of the member 13 may be formed to be flat. Since the bottom surface of the member 13 closely fits the top surface of the component, and a contact area is secured, the heat of the member 13 may easily be transferred to the component.

For example, the uniformity of the temperature distribution over the entirety of the member 13 may be improved by increasing the thermal conductivity of the material of the member 13. For example, in the case where the member 13 includes a material having a thermal conductivity that makes the temperature of the component not locally exceed an allowable temperature, local heating of the component may be reduced.

The temperature distribution of the bottom surface of the member 13 with which the component is in contact varies in accordance with, for example, the thickness or internal structure of the member 13. For example, if the thickness or internal structure of the member 13 is determined so that the component does not locally exceed the allowable temperature, the local heating of the component may be reduced. For example, in the case where the interior of the member 13 has a hollow, heat transferred from a portion, to which the light of the light source 11 is radiated, bypasses the hollow portion and is transferred to the component. Therefore, heating of a portion of the component that is close to the portion to which the light of the light source 11 is radiated may be reduced.

The heat absorption rate of the member 13 increases as the light absorption rate in the portion to which the light of the light source 11 is radiated increases. For example, if a surface of the interior of the hole 14 in the member 13 is treated so that the light absorption rate thereof is increased, the heat of the light of the light source 11 may easily be transferred to the component.

The apparatus 10 for mounting and removing a component depicted in FIG. 1 may mount and remove a component that is supported by solder. When a component that is supported by the solder and that changes its position when the solder is melted is mounted and removed using the apparatus 10 for mounting and removing a component depicted in FIG. 1, the melting of the solder may be sensed by the light sensor 12. The component, which is supported by the solder and which changes its position when the solder is melted, may include a ball grid array (BGA) integrated circuit (IC) chip that is not underfilled with an underfill material. If a BGA IC chip is not underfilled with an underfill material, it will be supported by solder balls arranged in a grid-like pattern, and thus, the BGA IC chip will be displaced when the solder is melted.

Figure 3A:
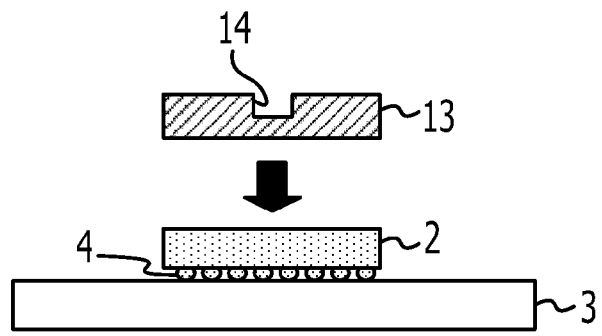
FIGS. 3A to 3C illustrate an exemplary method for removing a component.
Figure 3B:
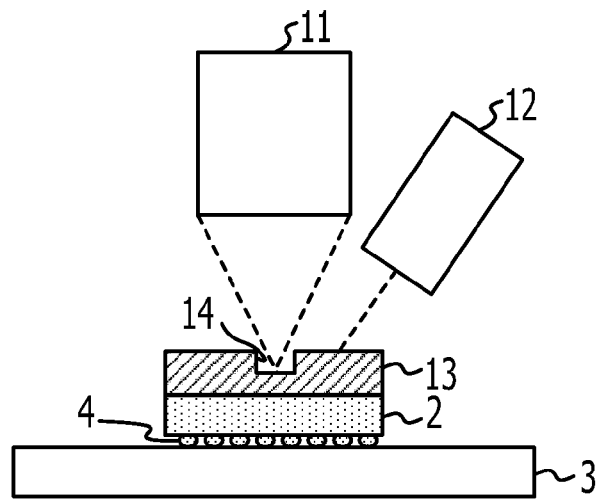
Figure 3C:
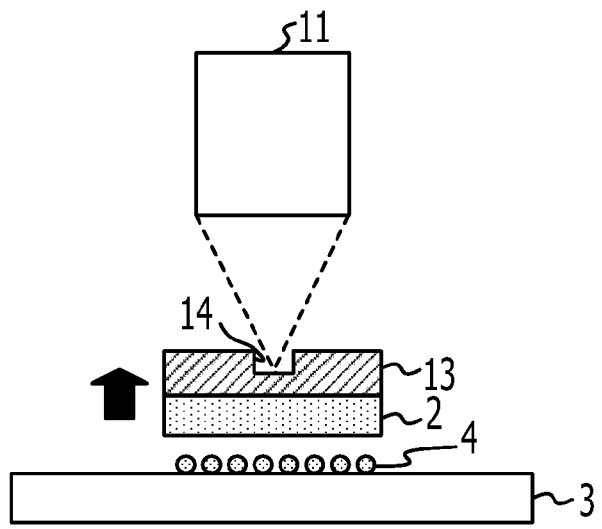

FIGS. 3A to 3C illustrate an exemplary method of removing a component. In FIGS. 3A to 3C, an IC chip may be removed from a substrate using the apparatus 10 for mounting and removing a component depicted in FIG. 1. For example, a BGA IC chip that is not underfilled with an underfill material may be removed, and also other IC chips or other components that are supported by solder may be removed. An operator may manually perform removal of a component by operating the apparatus 10 for mounting and removing a component, and also ther removal of a component is automatically performed.

When an IC chip 2 is removed from a substrate 3 using the apparatus 10 for mounting and removing a component, the operator mounts the member 13 on the IC chip 2, which is fixed on the substrate 3, as depicted in FIG. 3A. The IC chip 2 fixed on the substrate 3 is supported by solder balls 4.

As depicted in FIG. 3B, the operator radiates the light of the light source 11 onto the hole 14 of the member 13 while measuring the position of the member 13 using the light sensor 12. The IC chip 2 is heated by the irradiation of the hole 14 with the light. The solder balls 4 are melted due to the heating of the IC chip 2. Since the IC chip 2 is in a state of being supported by the solder balls 4, the IC chip 2 will be displaced when the solder balls 4 are melted. The displacement of the IC chip 2 is sensed by the light sensor 12, which measures the position of the member 13.

When the melting of the solder balls 4 is sensed by the light sensor 12, as depicted in FIG. 3C, the operator removes the IC chip 2 from the substrate 3. Thus, the removal of the IC chip 2 using the apparatus 10 for mounting and removing a component is completed.

Figure 4A:
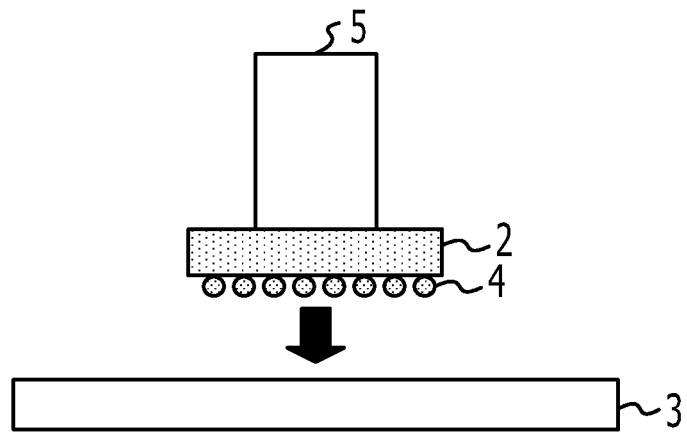
FIGS. 4A to 4D illustrate an exemplary method for mounting a component.
Figure 4B:
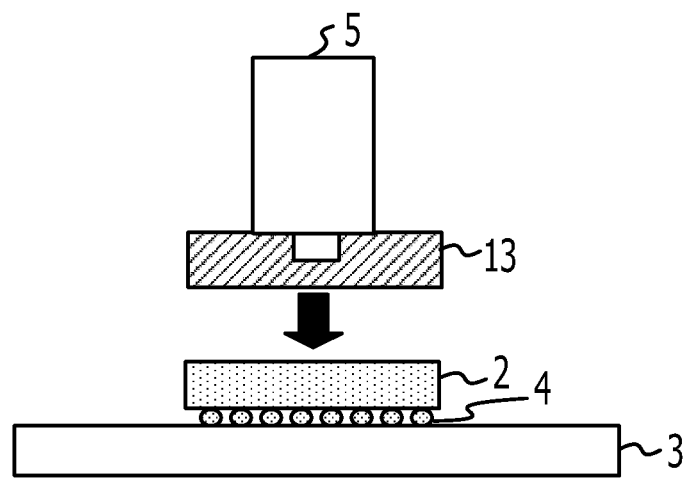
Figure 4C:
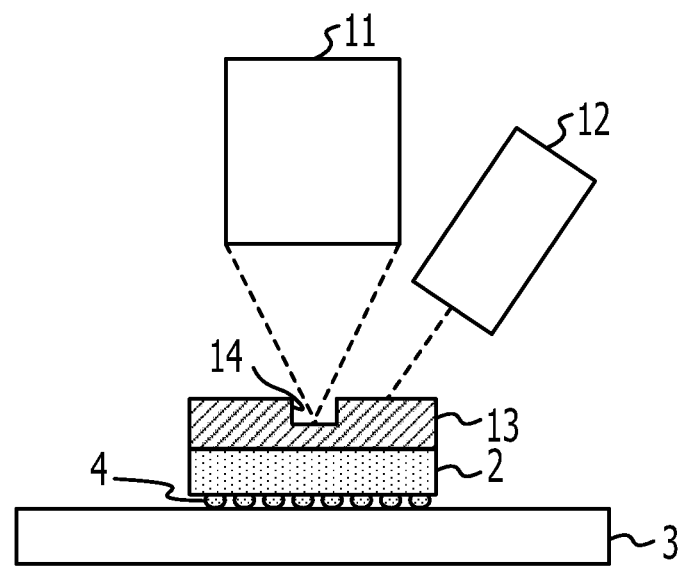

FIGS. 4A to 4C illustrate an exemplary method for mounting a component. In FIGS. 4A to 4C, the IC chip 2 may be mounted on the substrate 3 using the apparatus 10 for mounting and removing a component. For example, a BGA IC chip that is not underfilled with an underfill material may be mounted, and also other IC chips or other components that are to be supported by solder may be mounted. The operator may perform mounting of a component by manually operating the apparatus 10 for mounting and removing a component, and also the control unit may automatically perform mounting of a component.

When the IC chip 2 is mounted on the substrate 3 using the apparatus 10 for mounting and removing a component, the operator places the IC chip 2, on which the solder balls 4 have been previously deposited, on the substrate 3 as depicted in FIG. 4A. The IC chip 2 placed on the substrate 3 is in a state of being supported by the solder balls 4. The IC chip 2 may be placed on the substrate 3 using, for example, a vacuum suction nozzle 5 as illustrated in FIG. 4A or by other methods.

As depicted in FIG. 4B, the operator mounts the member 13 on the IC chip 2. The member 13 may be placed on the IC chip 2 using, for example, the vacuum suction nozzle 5 as illustrated in FIG. 4B or by other methods.

As depicted in FIG. 4C, the operator radiates the light of the light source 11 onto the hole 14 of the member 13 while measuring the position of the member 13 using the light sensor 12. The IC chip 2 is heated by irradiation with the light. The solder balls 4 are melted due to the heating of the IC chip 2. Since the IC chip 2 is in a state of being supported by the solder balls 4, the IC chip 2 will be displaced when the solder balls 4 are melted. The displacement of the IC chip 2 is sensed by the light sensor 12, which measures the position of the member 13. When the melting of the solder balls 4 is sensed by the light sensor 12, the operator stops the irradiation of the hole 14 with the light. The irradiation of the hole 14 with the light may be stopped by, for example, blocking the light from the light source 11, stopping power supply to the light source 11, or displacing the IC chip 2 out of an irradiation range of the light of the light source 11. When the irradiation of the hole 14 with the light is stopped, the solder balls 4 cool and become solid, and as a result, the IC chip 2 will be fixed on the substrate 3.

Figure 4D:
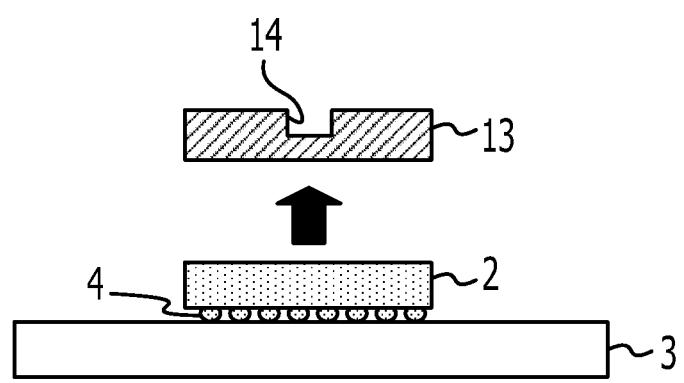

The operator removes the member 13 as depicted in FIG. 4D. Thus, the mounting of the IC chip 2 on the substrate 3 using the apparatus 10 for mounting and removing a component is completed.

For example, when the IC chip 2 is to be repaired, the IC chip 2 fixed on the substrate 3 will be replaced through the above-described removing and mounting processes performed in series. In the case of removing the IC chip 2, the IC chip 2 fixed on the substrate 3 will be removed through the above-described removing process. In the case of mounting the IC chip 2, the IC chip 2 is mounted through the above-described mounting process. When the above-described removing and mounting processes are performed in series, the height of the solder balls 4 of the substrate 3 may be made uniform after removing the IC chip 2 and before mounting a new IC chip 2. Occurrence of electrical contact failure may be reduced.

In the above-described mounting and removing processes, when the operator manually operates the apparatus 10 for mounting and removing a component, the apparatus 10 for mounting and removing a component may activate an indicator that uses sound or light so as to indicate the operator of the melting of the solder balls 4 when, for example, the displacement of the IC chip 2 is sensed by the light sensor 12.

When the above-described mounting and removing processes are automatically performed by the control unit, the apparatus 10 for mounting and removing a component may inform the control unit of the melting of the solder balls 4. The control unit, which is informed of the melting of the solder balls 4, may automatically control various devices based on this information, and make the various devices perform processes that are to be performed when the solder balls 4 are melted.

Figure 5:
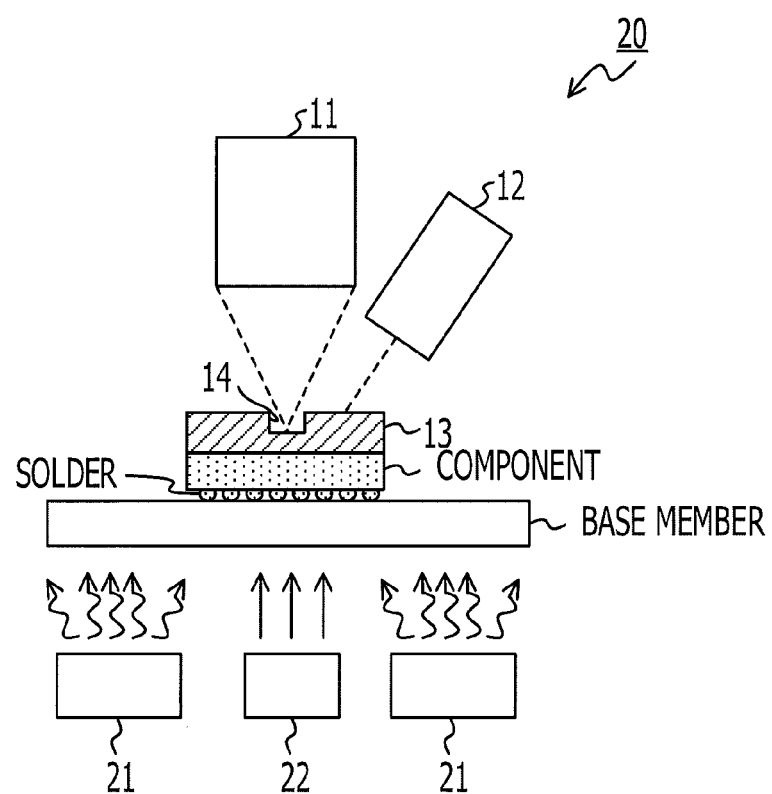
FIG. 5 illustrates an exemplary apparatus for mounting and removing a component.

FIG. 5 illustrates an exemplary apparatus for mounting and removing a component. An apparatus 20 for mounting and removing a component depicted in FIG. 5 includes a light source 11, a light sensor 12, a member 13, infrared (IR) heaters 21 that emit infrared radiation, and a hot air generating unit 22 that generates high temperature air. The light source 11, the light sensor 12, and the member 13 depicted in FIG. 5 may be substantially the same as or similar to the light source 11, the light sensor 12, and the member 13 depicted in FIG. 1, respectively.

When a component is heated by radiation from the light source 11, the IR heaters 21 heat a base member for fixing the component, for example, the substrate 3, from the backside of the base member in order to reduce warpage of the base member due to a heating of a part of the base member.

When the component is heated by radiation from the light source 11, the hot air generating unit 22 blows, against the backside of the base member, the high temperature air that has been heated to such a degree that melting of solder that supports the component is not hindered in order to reduce a temperature rise of the base member on the backside of the component.

In the apparatus 20 for mounting and removing a component, when the component is heated by irradiation with the light source 11, damage to the base member for fixing the component may be reduced.

Figure 6:
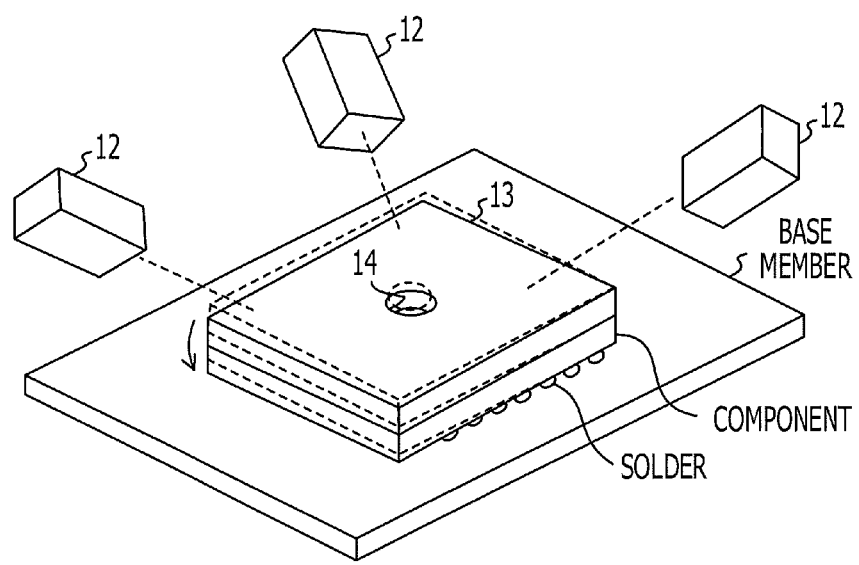
FIG. 6 illustrates an exemplary inclination of a component.

For example, the apparatus 20 for mounting and removing a component may include a plurality of the light sensors 12. Other structures of the apparatus 20 for mounting and removing a component may be substantially the same as or similar to those of the apparatus 10 for mounting and removing a component depicted in FIG. 1. In the case where the plurality of light sensors 12 are included in the apparatus 20 for mounting and removing a component, the melting of the solder may be sensed even if the component is inclined due to insufficient melting of the solder. FIG. 6 illustrates an exemplary inclination of a component. A state of a component that is inclined based on the melting of the solder is depicted in FIG. 6. Dashed lines depicted in FIG. 6 denote locations of the component and member 13 before the melting of the solder.

If the component is displaced so as to be inclined due to insufficient melting of the solder, the displacement of the component may not be able to be sensed by just one light sensor 12. The probability of failure to sense the melting of the solder may be reduced by using a plurality of the light sensors 12. When the displacement of the component is monitored at at least three measurement points, the component will be displaced based on the inclination of the component at least any one of the measurement points. Therefore, if displacements of portions of the component that are different from one another are measured by at least three light sensors 12, the melting of the solder may be sensed.

Figure 7:
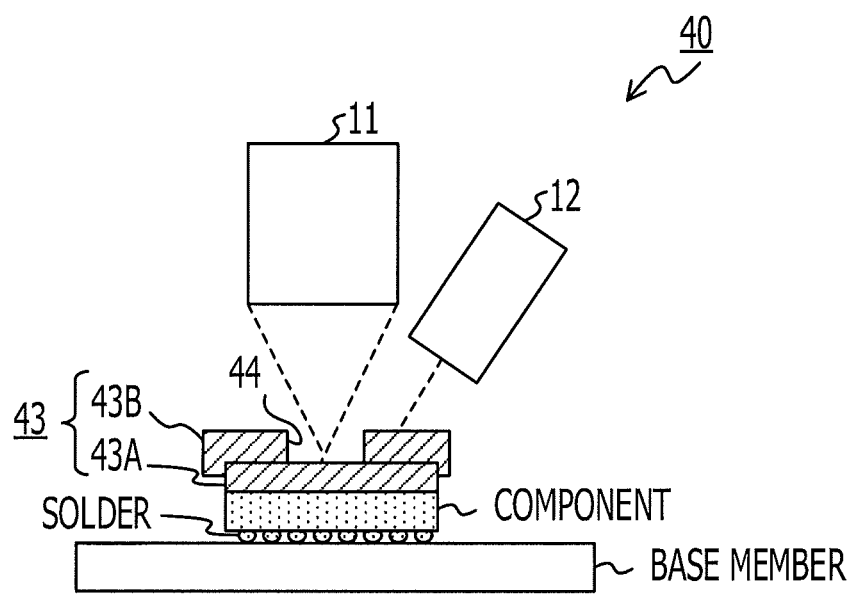
FIG. 7 illustrates an exemplary apparatus for mounting and removing a component.

FIG. 7 illustrates an exemplary apparatus for mounting and removing a component. An apparatus 40 for mounting and removing a component depicted in FIG. 7 includes a member 43 that includes a first member 43A and a second member 43B. The member 43 may correspond to the above-mentioned member 13. Other structures depicted in FIG. 7 may be substantially the same as or similar to those depicted in FIG. 1 or FIG. 5.

The first member 43A may be a member that is to be mounted in direct contact with a component and may also be a member that receives the light of the light source 11 and transfers the heat of the light of the light source 11 to the component. The second member 43B is a member that is to be mounted on the first member 43A and includes a hole 44 that passes therethrough. The hole 44 may correspond to the hole 14, which is included in the above-mentioned member 13. When the second member 43B is in a state of being mounted on the first member 43A, and the light from the light source 11 is adjusted to irradiate the hole 14, the temperature of the first member 43A is increased by the heat of the light incident on the hole 44, and as a result, the component is heated.

In the apparatus 40 for mounting and removing a component, a plurality of the first member 43A and a plurality of the second member 43B may be used in combination with one another. Therefore, a member 43 that corresponds to the shape and size of a component to be heated, the intensity of the light of the light source 11, the melting point of solder, the amount and size of the solder, or other various conditions may be formed by using combinations of the first members 43A and the second members 43B.

In the apparatus 40 for mounting and removing a component, materials of the first member 43A and the second member 43B may differ from each other. For example, the first member 43A may include a material that has good heat conductivity, and the second member 43B may include a material that has good heat insulation. The amount of heat to be released from the member 43 may be reduced, and as a result, the component may effectively be heated.

Figure 8:
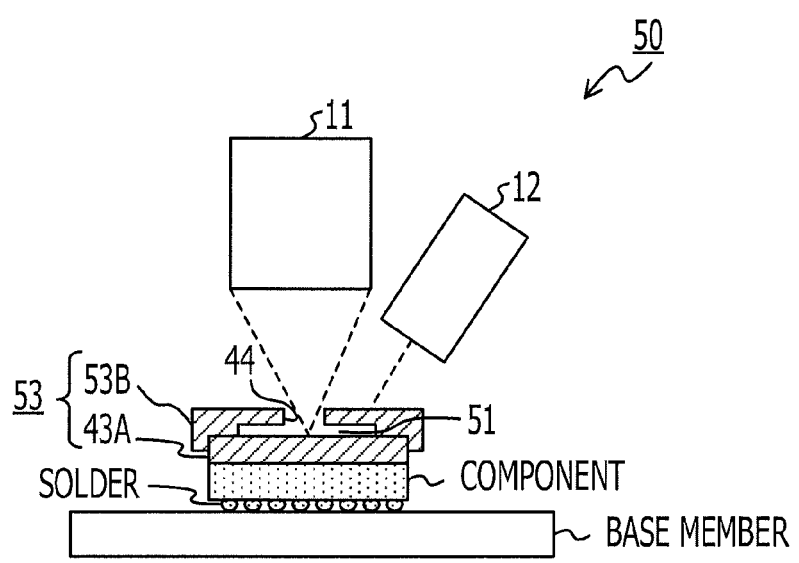
FIG. 8 illustrates an exemplary apparatus for mounting and removing a component.

FIG. 8 illustrates an exemplary apparatus for mounting and removing a component. In an apparatus 50 for mounting and removing a component depicted in FIG. 8, a hollow 51 is formed in a second member 53B that corresponds to the above-described second member 43B. Other structures of the apparatus 50 for mounting and removing a component may be substantially the same as or similar to those depicted in FIG. 7. For example, the member 53 that corresponds to the above-described member 43 includes the first member 43A and the second member 53B.

Figure 9:
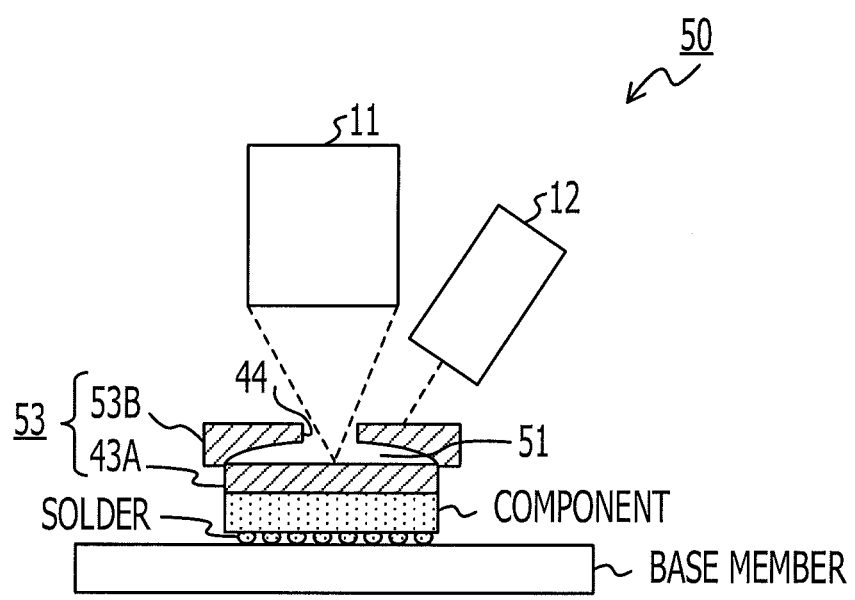
FIG. 9 illustrates an exemplary apparatus for mounting and removing a component.

The hollow 51 may cause light incident on the hole 44 to be attenuated. When the second member 53B is mounted on the first member 43A, and the light radiated from the light source 11 is incident on the hole 44, the incident light is repeatedly reflected from a bottom surface, top surface, and wall surface of the interior of the hollow 51. Since the bottom surface, top surface, and wall surface of the interior of the hollow 51 absorb at least part of the incident light, the light, which is repeatedly reflected from the bottom surface, top surface, and wall surface of the interior of the hollow 51, will be attenuated. Therefore, the amount of light that is scattered from the hole 44 may be reduced. FIG. 9 illustrates an exemplary apparatus for mounting and removing a component. The hollow 51 may have a rectangular shape as depicted in FIG. 8 or may have a hemispherical shape as depicted in FIG. 9.

Figure 10:
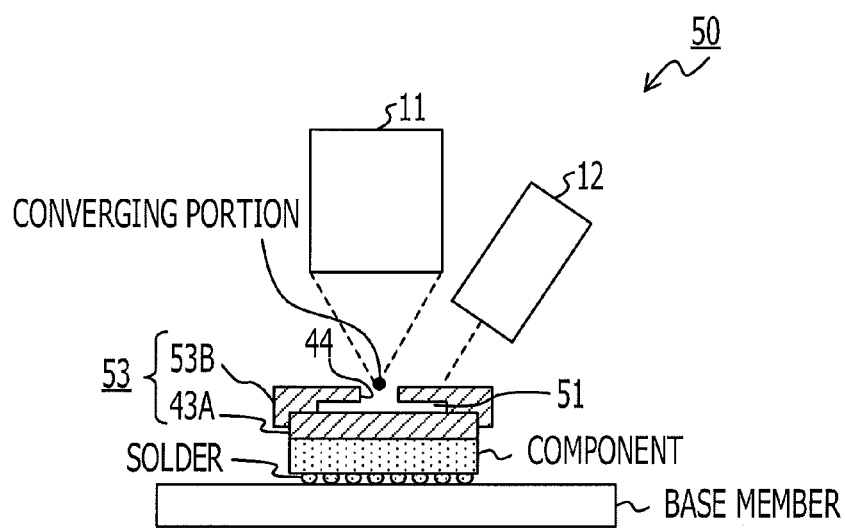
FIG. 10 illustrates an exemplary apparatus for mounting and removing a component.

When the hollow 51 is provided, a portion at which light of the light source 11, for example, a point source, is converged, for example, a converging portion, may be set so as to further reduce the amount of the light that is scattered from the hole 44. FIG. 10 illustrates an exemplary apparatus for mounting and removing a component. Since a converging portion of the light of the light source 11 is separated from a surface of the first member 43A and disposed in the vicinity of the hole 44 provided in the second member 53B in FIG. 10, the hole 44 may be set to have a minimum size. When the hole 44 is set to have a minimum size, the amount of light that passes through the hole 44 is reduced, and thus, the amount of the light that is scattered from the hole 44 may be reduced, and the amount of scattered light that is incident on the light sensor 12 may be reduced. Although the converging portion is denoted by a dot in FIG. 10, the converging portion may be a portion in which light is converged to a point and may also be a portion that has a condensing diameter of about a few mm.

Figure 11:
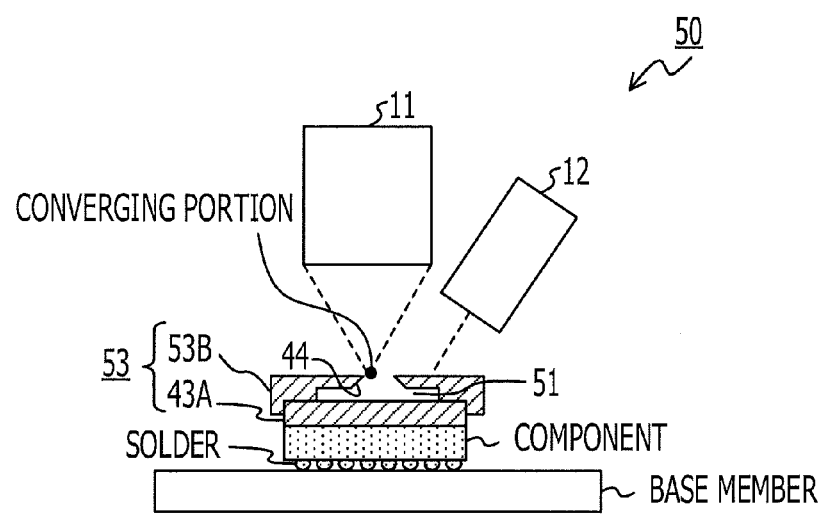
FIG. 11 illustrates an exemplary apparatus for mounting and removing a component.

FIG. 11 illustrates an exemplary apparatus for mounting and removing a component. When the hole 44 has the minimum size, the light may interfere with the inner surface of the hole 44 beneath the converging portion. Therefore, for example, as depicted in FIG. 11, when the hole 44 is formed so that an inner diameter of the hole 44 beneath the converging portion is larger than an inner diameter of a portion of the hole 44 in which the converging portion is located, the interference with the hole 44 by the light may be reduced. Therefore, the amount of the light that is scattered from the hole 44 may be reduced by minimizing the inner diameter of the portion of the hole 44 in which the converging portion of the light of the light source 11 is located.

Figure 12:
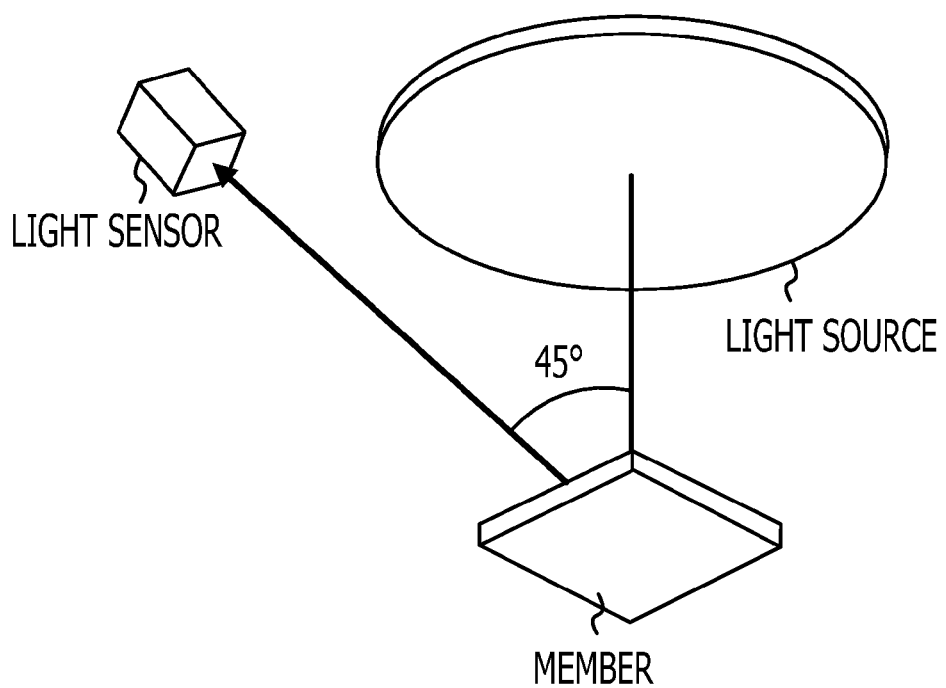
FIG. 12 illustrates an exemplary analytic model.

FIG. 12 illustrates an exemplary analytic model. An analytic model depicted in FIG. 12 may correspond to the apparatus 50 for mounting and removing a component depicted in FIG. 10. The analytic model may include, for example, the following light source, member, and light sensor.

Light Source: Output 100 W, Diameter 45 mm, Halogen lamp

Member: Dimensions 30×30 mm, Height of Hollow 1 mm, Width of Hollow 25 mm, Depth of Hollow 25 mm Light Sensor: Light Receiving Area 13×9 mm, Sensor Light Source 0.5 mW The effect of reducing light scattered by the hole 44 of the member 53 is simulated with the analytic model. The amount of scattered light received by the light sensor in the case where light is radiated onto the first member 43A with the second member 53B removed from the member 53 and in the case where the light is radiated onto the first member 43A on which the second member 53B is mounted is simulated. The amount of scattered light received by the light sensor in the latter case is about 84% lower than that in the former case. If a hole is provided in a member, the amount of scattered light that is incident on the light sensor may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An apparatus of mounting and removing a component comprising:
   a light source configured to radiate light toward a component supported by solder;
   a light sensor configured to sense displacement of the component; and
   a member mounted on the component on a first surface of the member, the member including a recess having a bottom in the member on a second surface of the member opposite to the first surface and being irradiated with the light of the light source, a part of the first surface which is located at a position corresponding to the bottom of the recess, being in contact with the component,
   wherein an opening of the recess faces the light source such that the light enters from the opening and irradiates the bottom of the recess.

2. The apparatus according to claim 1, wherein the light sensor senses the displacement of the component when the solder is melted by light.

3. The apparatus according to claim 1, wherein a whole of the first surface of the member is in contact with an upper surface of the component on an opposite side to the solder.

4. The apparatus according to claim 1, wherein the recess has such a size as to encompass a range to be irradiated with the light of the light source.

5. The apparatus according to claim 1, wherein at least one of a position of the recess, a dimension of the recess and a cross-sectional shape of the recess, is set so that an intensity of scattered light that scatters from the recess and is incident on the light sensor, is adjusted to be less than a value.

6. The apparatus according to claim 5, wherein the value is an intensity of reflected light from the member that is incident on the light sensor.

7. A method of mounting a component comprising:
   mounting a member on a component to be supported by solder on a first surface of the member, the member including a recess having a bottom in the member on a second surface of the member opposite to the first surface, a part of the first surface which is located at a position corresponding to the bottom of the recess, being in contact with the component;
   irradiating the recess with a light;
   sensing melting of the solder with a light sensor configured to sense displacement of the component; and
   stopping irradiation of the member with the light for which the melting of the solder is sensed,
   wherein an opening of the recess faces the light source such that the light enters from the opening and irradiates the bottom of the recess.

8. The method according to claim 7 further comprising, sensing the displacement of the component when the solder is melted by light.

9. The method according to claim 7, wherein a whole of the first surface of the member is in contact with an upper surface of the component on an opposite side to the solder.

10. The method according to claim 7, wherein the recess has such a size as to encompass a range to he irradiated with the light of the light source.

11. The method according to claim 7, wherein at least one of a position of the recess, a dimension of the recess and a cross-sectional shape of the recess, is set so that an intensity of scattered light that scatters from the recess and is incident on the light sensor, is adjusted to be less than a value.

12. The method according to claim 7, wherein the value is an intensity of reflected light from the member that is incident on the light sensor.

13. A method of removing a component comprising:
   mounting a member on a component supported by solder on a first surface of the member, the member including a recess having a bottom in the member on a second surface of the member opposite to the first surface, a part of the first surface which is located at a position corresponding to the bottom of the recess, being in contact with the component;
   irradiating the recess with a light;
   sensing melting of the solder with a light sensor that senses displacement of the component; and
   removing the component for which the melting of the solder is sensed,
   wherein an opening of the recess faces the light source such that the light enters from the opening and irradiates the bottom of the recess.

14. The method according to claim 13 further comprising, sensing the displacement of the component when the solder is melted by light.

15. The method according to claim 13, wherein the recess is provided at a center of a surface of the member.

16. The method according to claim 13, wherein the recess has such a size as to encompass a range to be irradiated with the light of the light source.

17. The method according to claim 13, wherein at least one of a position of the recess, a dimension of the recess and a cross-sectional shape of the recess, is set so that intensity of scattered light that scatters from the recess and is incident on the light sensor, is adjusted to be less than a value.

18. The method according to claim 13, wherein the value is an intensity of reflected light from the member that is incident on the light sensor.

19. The apparatus according to claim 1, wherein the recess is provided at a center of a surface of the member.

20. The method of mounting according to claim 7, wherein the recess is provided at a center of a surface of the member.

* * * * *